(12) United States Patent
Sasamoto et al.

(10) Patent No.: US 9,864,266 B2
(45) Date of Patent: Jan. 9, 2018

(54) PHOTOMASK BLANK

(71) Applicant: Shin-Etsu Chemical Co., Ltd., Tokyo (JP)

(72) Inventors: Kouhei Sasamoto, Joetsu (JP); Yukio Inazuki, Joetsu (JP)

(73) Assignee: SHIN-ETSU CHEMICAL CO., LTD., Tokyo (JP)

(*) Notice: Subject to any disclaimer, the term of this patent is extended or adjusted under 35 U.S.C. 154(b) by 28 days.

(21) Appl. No.: 15/239,551

(22) Filed: Aug. 17, 2016

(65) Prior Publication Data

US 2017/0068154 A1 Mar. 9, 2017

(30) Foreign Application Priority Data

Sep. 3, 2015 (JP) ................................ 2015-173895

(51) Int. Cl.
*G03F 1/50* (2012.01)
*G03F 1/38* (2012.01)
*G03F 1/20* (2012.01)
*G03F 1/26* (2012.01)
*G03F 1/80* (2012.01)

(52) U.S. Cl.
CPC ................. *G03F 1/20* (2013.01); *G03F 1/26* (2013.01); *G03F 1/80* (2013.01)

(58) Field of Classification Search
None
See application file for complete search history.

(56) References Cited

U.S. PATENT DOCUMENTS

| 6,599,667 B2 | 7/2003 | Yusa et al. |
| 7,771,893 B2 | 8/2010 | Yoshikawa et al. |
| 9,299,531 B2 | 3/2016 | Asami et al. |
| 2008/0063950 A1* | 3/2008 | Yoshikawa ............... G03F 1/46 430/5 |

(Continued)

FOREIGN PATENT DOCUMENTS

| EP | 1022614 A1 | 7/2000 |
| EP | 1650600 A2 | 4/2006 |
| JP | 2001-312043 A | 11/2001 |

(Continued)

OTHER PUBLICATIONS

Extended European Search Report, dated Mar. 9, 2017, for European Application No. 16184791.8.

*Primary Examiner* — Stephen Rosasco
(74) *Attorney, Agent, or Firm* — Birch, Stewart, Kolach & Birch, LLP

(57) ABSTRACT

A photomask blank comprising a transparent substrate and a chromium-containing film is provided. The chromium-containing film is constructed by one or more chromium compound layers which are formed of a chromium compound containing Cr, N and optionally O, and have a composition having a Cr content $\geq 30$ at % and a total Cr+N+O content $\geq 93$ at %, and meeting the formula: $3Cr \leq 2O+3N$. A chromium compound layer meeting a first composition having an N/Cr atomic ratio $\geq 0.95$, a Cr content $\geq 40$ at %, a total Cr+N content $\geq 80$ at %, and an O content $\leq 10$ at % is included to a thickness of more than 70% to 100% of the overall thickness of the chromium-containing film.

8 Claims, 6 Drawing Sheets

(56) References Cited

U.S. PATENT DOCUMENTS

2010/0261101 A1    10/2010   Yoshikawa et al.
2015/0160549 A1    6/2015   Sasamoto et al.

FOREIGN PATENT DOCUMENTS

| JP | 3093632 U | 5/2003 |
| JP | 2003-195479 A | 7/2003 |
| JP | 2003-195483 A | 7/2003 |
| JP | 2007-33470 A | 2/2007 |
| JP | 2014-216407 A | 11/2014 |

\* cited by examiner

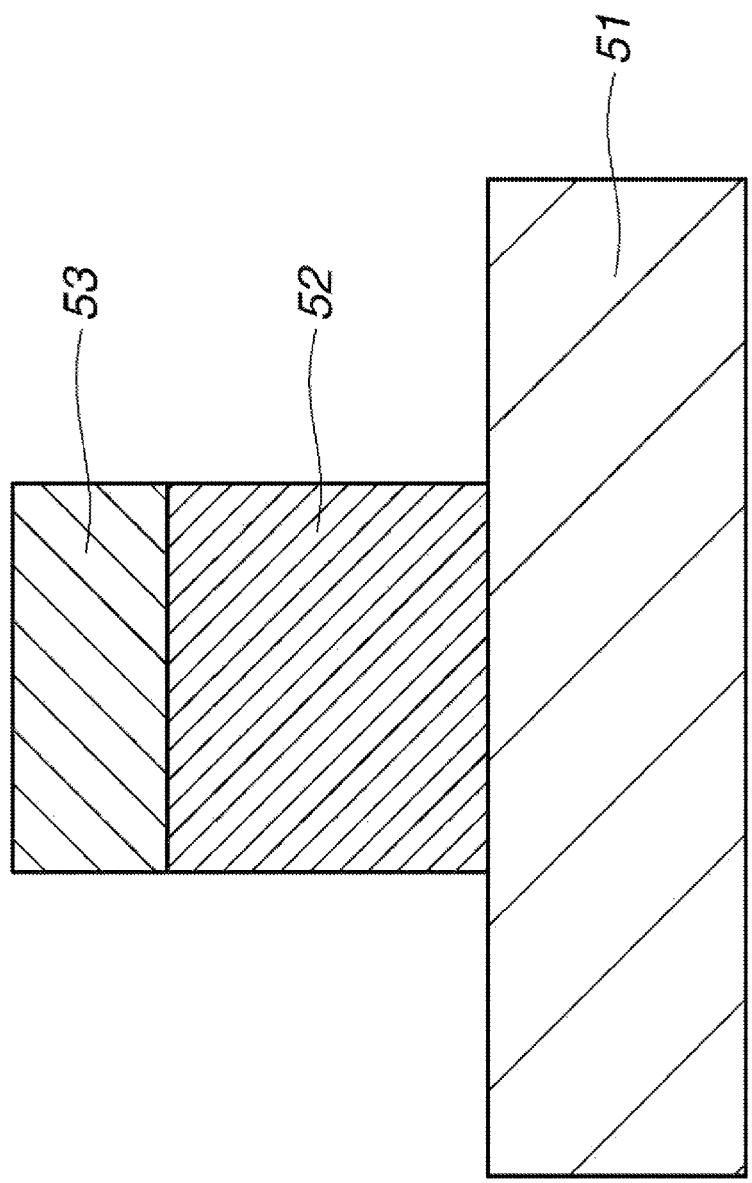

PHOTOMASK BLANK

CROSS-REFERENCE TO RELATED APPLICATION

This non-provisional application claims priority under 35 U.S.C. §119(a) on Patent Application No. 2015-173895 filed in Japan on Sep. 3, 2015, the entire contents of which are hereby incorporated by reference.

TECHNICAL FIELD

This invention relates to a photomask blank which is processed into a photomask suitable for pattern transfer using exposure light of sub-250 nm wavelength.

BACKGROUND ART

For goals like a higher speed of operation and a saving of power consumption of microelectronic devices, the challenge to higher integration of large-scale integrated circuits continues. To meet increasing demands for shrinkage of circuit patterns, the advanced semiconductor microprocessing technology becomes important. For example, the technology for shrinkage of circuit-constructing wiring patterns and the technology for shrinkage of contact hole patterns for cell-constructing inter-layer connections become essential.

The advanced microprocessing technology relies on the photolithography using photomasks. The photomask is one important area of the miniaturization technology as are the lithography system and resist material. For the purpose of obtaining a photomask having a fine-size wiring pattern or fine-size contact hole pattern, efforts are made to develop the technique of forming a more fine and accurate pattern on a photomask blank.

In order to form a high accuracy photomask pattern on a photomask substrate, it is of first priority to pattern a resist film on a photomask blank at a high accuracy. Since the photolithography for microprocessing semiconductor substrates employs reduction projection, the size of a pattern formed on a photomask is about 4 times the size of a pattern formed on a semiconductor substrate. This does not mean that the accuracy of the pattern formed on the photomask is accordingly loosened. It is necessary that the photomask pattern be formed at a high accuracy.

At the present, the size of a circuit pattern written on a semiconductor substrate by photolithography is far smaller than the wavelength of exposure light. If reduction exposure is carried out using a photomask having a pattern which is a mere 4-time magnification of the circuit pattern, the photomask pattern is not faithfully transferred to the resist film due to interference of exposure light and other impacts.

Super-resolution masks addressing the problem include OPC masks in which the so-called optical proximity correction (OPC), i.e., the technology for correcting the optical proximity effect of degrading transfer properties is applied to photomasks and phase shift masks which cause a phase shift of 180° to exposure light transmitted by the pattern, to establish a sharp intensity distribution of incident light. For example, in some OPC masks, an OPC pattern (hammer head, assist bar or the like) having a size of less than half of a circuit pattern is formed. The phase shift masks include halftone, Levenson and chromeless types.

In general, a mask pattern is formed by starting with a photomask blank having a light-shielding film on a transparent substrate, forming a photoresist film on the photomask blank, exposing the photoresist film to light or electron beam (EB) to write a pattern, and developing the photoresist film to form a photoresist pattern. Then, with the photoresist pattern made etching mask, the light-shielding film is etched or patterned to form the photomask pattern. For obtaining a fine photomask pattern, it is effective to reduce the thickness of a photoresist film (i.e., thinner resist film) for the following reason.

If only a resist pattern is shrunk without reducing the thickness of a resist film, the resist pattern feature functioning as the etching mask for the light-shielding film has a higher aspect ratio (ratio of resist film thickness to feature width). In general, as the aspect ratio of resist pattern features becomes higher, the pattern profile is more likely to degrade. Then the accuracy of pattern transfer to the light-shielding film is reduced. In extreme cases, the resist pattern partially collapses or strips off, resulting in pattern dropouts. In association with the shrinkage of a photomask pattern, it is necessary that the resist film used as the etching mask during patterning of a light-shielding film be thinned to prevent the aspect ratio from becoming too high. An aspect ratio of up to 3 is generally recommended. To form a resist pattern having a feature width of 70 nm, for example, a resist film thickness of up to 210 nm is preferable.

On the other hand, in the ArF lithography using a photomask and ArF excimer laser as exposure light, the photomask pattern is transferred to a processable substrate, typically a photoresist film on a semiconductor wafer. Under the current advance of the miniaturization technology, the pattern width (on-wafer size) is less than 100 nm for standard products and less than 20 nm for advanced products. The minimum width of a main pattern on the photomask that complies with the reduced pattern width is about 100 nm, and the minimum width of an auxiliary pattern is reduced below 100 nm (specifically, about 70 nm) as a result of complication of OPC.

For the light-shielding film which is etched using the pattern of photoresist as an etching mask, a number of materials have been proposed. In particular, neat chromium films and chromium compound films containing chromium and at least one of nitrogen, oxygen and carbon are generally used as the light-shielding film material. For example, Patent Documents 1 to 3 disclose photomask blanks wherein chromium compound films are formed as the light-shielding film having light shielding properties necessary for the photomask blank for use in ArF excimer laser lithography.

For the fabrication of photomasks, the exposure method using electron beam (EB) is the mainstream of resist patterning. For EB emission, a high accelerating voltage of 50 keV is employed in order to enable further miniaturization. While there is a tendency that the resist reduces its sensitivity in order to achieve a higher resolution, in the EB lithography system, the current density for EB emission experiences a remarkable leap from 40 $A/cm^2$ to 800 $A/cm^2$ from the aspect of productivity enhancement.

When EB is directed to an electrically floating photomask blank, electrons accumulate on the surface of the photomask blank to charge it at a negative potential. An electric field due to the electric charge causes the EB trajectory to be bent, resulting in a low accuracy of writing position. To avoid such fault, the EB lithography system adapted for high energy/high density EB writing is designed such that EB writing is performed with the photomask blank being grounded. For example, Patent Document 4 discloses an earth mechanism for grounding a photomask blank using an earth pin.

However, if ground resistance is significant, the potential at the photomask blank surface increases by the product of ground current and ground resistance, and the accuracy of writing position is accordingly reduced. If EB writing is performed in the state where the ground resistance is very high, an abnormal discharge or substrate failure can occur within the imaging vacuum chamber, causing contamination to the system. It is thus important to acquire a sufficient ground resistance, suggesting that a grounding method with a low ground resistance is required for the EB lithography system, and the photomask blank must have a sufficient conductivity.

CITATION LIST

Patent Document 1: JP-A 2003-195479
Patent Document 2: JP-A 2003-195483
Patent Document 3: JP-U 3093632
Patent Document 4: JP-A 2014-216407
Patent Document 5: JP-A 2007-033470
Patent Document 6: JP-A 2001-312043

DISCLOSURE OF INVENTION

A chromium-containing film such as chromium compound film serving as the light-shielding film is generally patterned by oxygen-containing chlorine-base dry etching, during which an organic film, typically photoresist film can be often etched to a noticeable extent. If the chromium-containing film is dry etched with a relatively thin resist film made mask, the resist film can be damaged during the etching so that the resist pattern may be deformed. It is then difficult to transfer the resist pattern accurately to the chromium-containing film.

The attempt to endow the photoresist or organic film with high resolution and high patterning accuracy as well as etch resistance encounters a technical barrier. The photoresist film must be reduced in thickness for the goal of high resolution whereas thinning of the photoresist film must be limited for the purpose of ensuring etch resistance to the resist film during etching of the chromium-containing film. This leads to a tradeoff relationship between high resolution/patterning accuracy and etch resistance. In order to mitigate the load on the photoresist film during patterning of the chromium-containing film and to reduce the thickness of the chromium-containing film for eventually forming a mask pattern of chromium-containing film at higher accuracy, the construction (including thickness and composition) of the chromium-containing film to be patterned must be ameliorated.

As the light-shielding film exhibiting a high etching rate during oxygen-containing chlorine-base dry etching that enables to mitigate the load on the photoresist film for eventually forming a fine-size photomask pattern at high accuracy, Patent Document 5 describes a light-shielding film based on chromium and having light elements, oxygen and nitrogen added thereto. However, the light element-containing chromium film reduces its conductivity with the increasing content of light elements. Since the EB lithography system is adapted to emit EB at a current density as high as 800 A/cm$^2$, a countermeasure for preventing the photomask blank from a charge buildup on EB writing is necessary.

With respect to the film based on chromium and having light elements, oxygen and nitrogen added thereto, for example, one countermeasure is to form the film as a multilayer structure film including at least one metallic chromium layer to retain conductivity. In this example, however, the etching rate of the metallic chromium layer is low, which means that a plurality of layers having significantly different etching rates are arranged in the thickness direction of the film. When the film is processed by dry etching, the cross-sectional profile of a pattern is degraded due to differencial side etching, leading to a degradation of dimensional accuracy.

An object of the invention is to provide a photomask blank which has such a conductivity that the photomask blank may be used in the EB lithography system adapted to emit EB at a high current density, and includes a chromium-containing film which is substantially defect-free and thin enough to be patterned using a thin photoresist film, to form a fine-size photomask pattern of satisfactory cross-sectional profile at a high accuracy.

When a chromium-containing film is processed by dry etching, the cross-sectional profile of the resulting pattern is largely affected by the composition of the chromium-containing film. Where the dry etching is anisotropic, as shown in the schematic view of FIG. 4, a chromium-containing film pattern 52 has a profile that its line width is a faithful representation of the line width of an etching mask pattern 53 of etching mask film or resist film in a thickness direction of the film. Where the dry etching is isotropic, as shown in the schematic view of FIG. 5, a chromium-containing film pattern 52 has a profile that its line width is constricted at the center in a thickness direction of the film, relative to the line width of an etching mask pattern 53. In FIGS. 4 and 5, a film or transparent substrate 51 is under the chromium-containing film.

To form a fine-size pattern accurately in a chromium-containing film which serves as a light-shielding film of a photomask, for example, the chromium-containing film must have a sufficient conductivity for use in an imaging system and a high etching rate. Where the chromium-containing film is a light-shielding film, it must have an optical density necessary as the light-shielding film with respect to exposure light. From the standpoint of obtaining a pattern of sufficient cross-sectional profile to provide a high dimensional accuracy, it is important that the chromium-containing film have a minimal variation of etching rate in thickness direction.

For the chromium-containing film, there is a tradeoff relationship between etching rate of oxygen-containing chlorine-base dry etching and conductivity. Thus a chromium-containing film of multilayer structure including a highly metallic chromium-containing layer and a light element-rich chromium-containing layer is applied in accordance with the desired optical properties. In the multilayer film composed of layers of different composition, however, the respective layers have different etching rates, and thus the respective layers are different in the extent to which etching proceeds from the side of a pattern in a width direction thereof. As a result of differential side etching, the pattern becomes of a profile wherein the pattern width varies in the thickness direction of the pattern, for example, a waist or barrel profile wherein the pattern width is narrower or wider at the center in the thickness direction, or a profile of T or inverted-T shape wherein the pattern width is wider at the top or bottom in the thickness direction. That is, the multilayer film is susceptible to a profile failure.

In an example where a chromium-containing film 52 includes a chromium compound layer 52a having a high etching rate, a chromium compound layer 52b having a low etching rate and a chromium compound layer 52c having a high etching rate stacked in order, as shown in the schematic view of FIG. 6, a layer having a higher etching rate is more susceptible to side etching, losing rectangularity in cross section. Although the side etching state is exaggeratingly depicted as steps in FIG. 6, actual side etching is not so extreme and becomes a continuous moderate variation. Anyhow, it is difficult to accurately transfer the shape of an etching mask pattern 53 to the chromium-containing film 52. In FIG. 6, a film or transparent substrate 51 is under the chromium-containing film.

When an underlying film, for example, a film of a material containing silicon and being free of a transition metal or a material containing silicon and a transition metal, or a transparent substrate is patterned using the chromium-containing film pattern as an etching mask, there arises an etching bias. That is, a substantial size deviation arises between the pattern of the film serving as etching mask and the pattern of the underlying film or substrate to be etched, leading to a degradation in pattern transfer performance.

Regarding a photomask blank comprising a transparent substrate and a chromium-containing film thereon, the inventor has found that when the chromium-containing film is constructed as a single chromium compound layer or a multilayer structure of chromium compound layers formed of a chromium compound containing chromium and nitrogen, or chromium, nitrogen and oxygen, and each chromium compound layer has a chromium content of at least 30 at % and a total content of chromium, nitrogen and oxygen of at least 93 at %, and meets the formula (1):

$$3Cr \leq 2O+3N \tag{1}$$

wherein Cr is a chromium content (at %), O is an oxygen content (at %), and N is a nitrogen content (at %), then the chromium-containing film has the highest etching rate and cleaning resistance; where the chromium-containing film is a single chromium compound layer, that chromium compound layer meets a first composition having an atomic ratio of nitrogen/chromium of at least 0.95, a chromium content of at least 40 at %, a total content of chromium and nitrogen of at least 80 at %, and an oxygen content of up to 10 at %; where the chromium-containing film is a multilayer structure film, the film includes at least one chromium compound layer meeting a first composition having an atomic ratio of nitrogen/chromium of at least 0.95, a chromium content of at least 40 at %, a total content of chromium and nitrogen of at least 80 at %, and an oxygen content of up to 10 at %, the total thickness of the at least one chromium compound layer meeting the first composition is in a range of more than 70% to 100% of the overall thickness of the chromium-containing film, and the remainder is constructed by a layer not meeting the first composition, then a conductivity necessary for use in the EB lithography system is available and the clear time of chlorine dry etching is shortened.

The entirety or majority of the chromium-containing film is constructed by the layer(s) meeting the first composition, which ensures that the chromium-containing film is reduced in thickness while a necessary conductivity for the photomask blank is maintained. As a result, the photoresist film can be reduced in thickness. Even when the chromium-containing film is of multilayer structure, the difference in side etching among chromium compound layers is minimized, resulting in an etched pattern of satisfactory cross-sectional profile. A pattern of chromium-containing film having a high resolution and high accuracy is obtained. Even when a fine photomask pattern is necessary as in a photolithography process of forming a resist pattern with a line width of not more than 0.1 µm on a processable substrate using exposure light of wavelength up to 250 nm, the chromium-containing film can be processed to form a satisfactory photomask pattern at a high accuracy.

Accordingly, the invention provides a photomask blank which is processed into a photomask suitable for pattern transfer using exposure light of wavelength up to 250 nm, comprising a transparent substrate and a chromium-containing film which is disposed on the substrate directly or through an optical film. The chromium-containing film is constructed by a single chromium compound layer or at least two chromium compound layers, each chromium compound layer is formed of a chromium compound containing chromium and nitrogen, or chromium, nitrogen and oxygen, and has a composition having a chromium content of at least 30 at % and a total content of chromium, nitrogen and oxygen of at least 93 at %, and meeting the formula (1):

$$3Cr \leq 2O+3N \tag{1}$$

wherein Cr is a chromium content (at %), O is an oxygen content (at %), and N is a nitrogen content (at %). When the chromium-containing film is constructed by a single chromium compound layer, the chromium compound layer meets a first composition having an atomic ratio of nitrogen/chromium of at least 0.95, a chromium content of at least 40 at %, a total content of chromium and nitrogen of at least 80 at %, and an oxygen content of up to 10 at %. When the chromium-containing film is constructed by at least two chromium compound layers, the chromium compound layers include at least one chromium compound layer meeting the first composition having an atomic ratio of nitrogen/chromium of at least 0.95, a chromium content of at least 40 at %, a total content of chromium and nitrogen of at least 80 at %, and an oxygen content of up to 10 at %, the total thickness of the at least one chromium compound layer meeting the first composition is in a range of more than 70% to 100% of the overall thickness of the chromium-containing film. The chromium-containing film has a sheet resistance of not more than 10,000 Ω/□.

In a preferred embodiment, the chromium-containing film has an optical density of 2.5 to 3.5 with respect to the exposure light.

In a preferred embodiment, the chromium-containing film is disposed on the transparent substrate through the optical film, and the optical film includes a phase shift film formed of a material containing silicon and being free of a transition metal or a material containing silicon and a transition metal.

The photomask blank may further comprise an etching mask film disposed on the side remote from the substrate of the chromium-containing film, the etching mask film being formed of a silicon-containing material.

In a preferred embodiment, the chromium-containing film has an optical density of 1.5 to 2.6 with respect to the exposure light.

In a preferred embodiment, the sum of optical densities of the chromium-containing film and the phase shift film with respect to the exposure light is 2.5 to 3.5.

In a preferred embodiment, the sum of optical densities of the chromium-containing film, the phase shift film, and the etching mask film with respect to the exposure light is 2.5 to 3.5.

In a preferred embodiment, the chromium-containing film is disposed on the transparent substrate through the optical film, and the optical film includes a light-shielding film formed of a material containing silicon and being free of a transition metal or a material containing silicon and a transition metal.

Advantageous Effects of Invention

The photomask blank of the invention includes a chromium-containing film which meets the desired optical density, has a high etching rate in dry etching, and is effective for reducing the load on a photoresist film which is used as an etching mask when a pattern of the chromium-containing film is formed by dry etching, contributing to a thickness reduction of the photoresist film. Since the chromium-containing film maintains conductivity, it is effective for preventing the photomask blank from a charge buildup in the EB lithography system, achieving a high writing accuracy. Since the chromium-containing film is thin and substantially defect-free and has a minimal variation of etching rate in thickness direction, the pattern after etching is of improved cross-sectional profile, leading to a high transfer performance of a photomask pattern. As a result, using the photomask blank of the invention, a fine-size photomask pattern can be formed at a high accuracy. This achieves both an improvement in productivity of photomasks and a reduction in size of the pattern formed on a processable substrate by pattern transfer using the photomask.

BRIEF DESCRIPTION OF ACCOMPANYING DRAWINGS

FIG. 4 is a schematic view of a cross-sectional profile of a pattern formed by anisotropic dry etching.

DESCRIPTION OF PREFERRED EMBODIMENTS

Figure 1A:
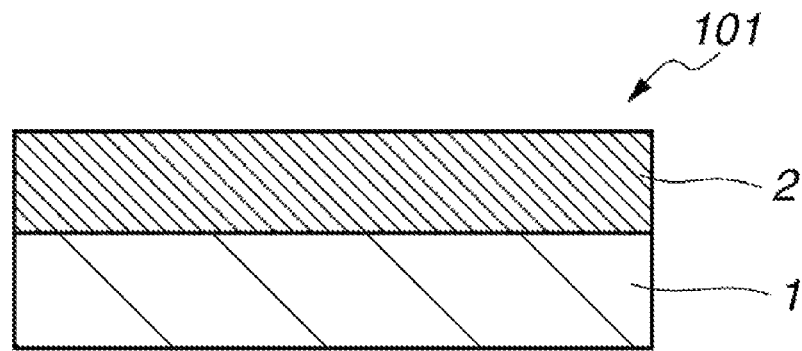
FIGS. 1A and 1B are a cross-sectional view of a photomask blank in a first embodiment of the invention, FIG. 1A showing a chromium-containing film of monolayer structure and FIG. 1B showing a chromium-containing film of multilayer structure.

The photomask blank of the invention is to be processed into a photomask suitable for pattern transfer using exposure light of wavelength up to 250 nm, especially up to 200 nm, typically KrF excimer laser of 248 nm, ArF excimer laser of 193 nm or $F_2$ laser of 157 nm. For the photomask suitable for pattern transfer using exposure light of wavelength up to 250 nm, for example, light of wavelength 257 nm is used in defect inspection, and light of wavelength 405 nm (solid-state laser diode) is used in readout of alignment marks.

The photomask blank includes a transparent substrate, typically quartz substrate, and a chromium-containing film disposed thereon directly or through one or more optical films. The chromium-containing film consists of a single chromium compound layer or at least two chromium compound layers (multilayer structure) and is formed of a material which can be etched by oxygen-containing chlorine-base dry etching.

The etching rate of a chromium-containing material during oxygen-containing chlorine-base dry etching (commonly used in etching of chromium-containing material) may be increased by adding a light element to the chromium-containing material. The addition of a light element enables high-speed etching of a film of chromium-containing material, i.e., a chromium-containing film, resulting in the advantage that when a chromium-containing film is etched through a photoresist film pattern (typically chemically amplified resist film subjected to EB imagewise writing) serving as the etching mask, the burden on the photoresist film may be mitigated. In some cases where a chromium-containing film is etched using an etching mask film of a silicon-containing material as a hard mask, a chromium-containing film having a high etching rate allows the etching mask film to be reduced in thickness. This leads to directly an improvement in etching bias, and indirectly a thickness reduction of a photoresist film which is used as the etching mask for an etching mask film.

The chromium-containing film is constructed by a single chromium compound layer or at least two chromium compound layers. Each chromium compound layer is formed of a chromium compound containing chromium and nitrogen, or chromium, nitrogen and oxygen, and has a composition (referred to as "common composition", hereinafter) having a chromium content of at least 30 at % and a total content of chromium, nitrogen and oxygen of at least 93 at %, and meeting the formula (1):

$$3Cr \leq 2O + 3N \qquad (1)$$

wherein Cr is a chromium content (at %), O is an oxygen content (at %), and N is a nitrogen content (at %). The formula (1) means that chromium in the chromium compound layer has an average valence number of at least 3.

Each chromium compound layer is a layer meeting all the chromium content, the total content of chromium, nitrogen and oxygen, and the formula (1) defined as the common composition. In each chromium compound layer, the chromium content is preferably at least 33 at % and up to 52 at %, more preferably up to 50 at %, and even more preferably up to 48 at %; and the total content of chromium, nitrogen and oxygen is preferably at least 95 at %, more preferably at least 97 at %, and even more preferably at least 98 at %.

The chromium compound layer is formed of the chromium compound containing chromium and nitrogen, or chromium, nitrogen and oxygen, examples of which include chromium nitride (CrN), chromium oxynitride (CrON), chromium nitride carbide (CrNC), and chromium oxide nitride carbide (CrONC), with chromium nitride (CrN) and chromium oxynitride (CrON) being preferred.

As mentioned above, the addition of nitrogen and/or oxygen to a chromium-containing material is effective for increasing the etching rate thereof. Specifically, when a light element is added to a metal material, its resistivity increases as the amount of the light element added increases, indicating a loss of conductivity. When a film made of a material having an increased resistivity is disposed on the side of a photomask blank remote from a transparent substrate, specifically on the side where a resist film for EB lithography is to be formed, a charge buildup can occur during EB exposure, inviting an undesirable lowering of writing accuracy. Particularly when oxygen is added as the light element, it invites an outstanding increase of resistivity, resulting in a high resistance film.

Therefore, according to the invention, the chromium-containing film is formed of chromium compounds containing chromium and nitrogen, or chromium, nitrogen and oxygen, and meets the common composition, defined above, and includes at least one chromium compound layer, preferably one or two chromium compound layers, and most preferably one chromium compound layer, meeting a first composition, that is, an atomic ratio of nitrogen to chromium of at least 0.95, a chromium content of at least 40 at %, a total content of chromium and nitrogen of at least 80 at %, and an oxygen content of up to 10 at %. The total thickness of chromium compound layer(s) meeting the first composition is more than 70%, preferably at least 90%, and up to 100% of the overall thickness of the chromium-containing film. If the total thickness of chromium compound layer(s) meeting the first composition is less than 70% of the overall thickness of the chromium-containing film, there is a risk that the overall thickness of the chromium-containing film which is necessary to provide the desired optical density becomes greater.

The layer meeting the first composition is a layer meeting all the nitrogen/chromium atomic ratio, chromium content, total content of chromium and nitrogen, and oxygen content, defined as the first composition. Preferably in the layer meeting the first composition, the nitrogen/chromium atomic ratio is up to 1.1. In the layer meeting the first composition, the chromium content is preferably at least 43 at %, and up to 52 at %, preferably up to 50 at %, and more preferably up to 48 at %; the total content of chromium and nitrogen is preferably at least 90 at %, more preferably at least 93 at %; the nitrogen content is preferably at least 43 at %, more preferably at least 46 at %, and up to 55 at %, more preferably up to 53 at %. In the layer meeting the first composition, the oxygen content is preferably up to 10 at %, more preferably up to 5 at %. Where two or more layers meeting the first composition are included, these layers may be of different compositions or some or all of these layers may be of identical composition.

In the chromium-containing film, where the film is of multilayer structure, the remainder chromium compound layer other than the chromium compound layer meeting the first composition is formed of a chromium compound containing chromium and nitrogen, or chromium, nitrogen and oxygen, and is constructed by at least one layer, preferably one or two layers, especially one layer, meeting the common composition, but not the first composition. The layer not meeting the first composition is preferably formed of a chromium compound containing chromium, nitrogen and oxygen. When the layer not meeting the first composition is applied as the remainder other than the layer meeting the first composition, the overall chromium-containing film has a high etching rate. Also, the layer not meeting the first composition is applicable as a layer having an antireflective layer function.

In the layer not meeting the first composition, the chromium content is preferably at least 30 at %, more preferably at least 33 at %, and up to 40 at %, more preferably up to 37 at %; the nitrogen content is preferably at least 5 at %, more preferably at least 8 at % and up to 35 at %, more preferably up to 30 at %; and the oxygen content is preferably at least 30 at %, more preferably at least 35 at % and up to 57 at %, more preferably up to 54 at %. Where two or more layers not meeting the first composition are included, these layers may be of different compositions or some or all of these layers may be of identical composition.

To the chromium compound layer, a light element other than nitrogen or oxygen and nitrogen may be added, and such other light elements are carbon, hydrogen, fluorine or the like. For example, the addition of carbon is effective for enhancing an etching rate. If the amount of carbon is too much, however, the etching rate becomes too high, and dry etching becomes more isotropic, rendering the control of cross-sectional profile difficult. When a carbon-added chromium compound layer is stacked on a carbon-free chromium compound layer, these layers have a relatively large difference in etching rate. If so, these layers are different in the extent of side etching during dry etching, so that the cross-sectional profile may be degraded. Further, due to the addition of carbon to the chromium compound layer, the chemical resistance of a photomask against sulfuric acid peroxide mixture or ozone peroxide mixture (used in periodic cleaning of the photomask in the step of processing a photomask blank into a photomask and the step of exposure through the photomask) is lowered. Then, it may be possible to adjust dry etching conditions so as to prevent the cross-sectional profile from being degraded, but the cross-sectional profile can be degraded by chemical cleaning. Then, when a light element other than nitrogen and oxygen, for example, carbon is added to the chromium compound layer, the content of the other light element is preferably controlled low, specifically to 7 at % or less, more specifically 5 at % or less, even more specifically 3 at % or less, and especially 2 at % or less.

In the photomask blank of the invention, the chromium-containing film should have a sheet resistance of not more than 10,000 ohm/square ($\Omega/\square$), preferably not more than 8,000$\Omega/\square$. When the chromium-containing film of mono or multilayer structure is composed of one or more chromium compound layers meeting the compositional requirements mentioned above, the overall chromium-containing film has a sheet resistance in the range. Particularly when the layer meeting the first composition is only one layer, that layer should preferably have a sheet resistance of not more than 10,000$\Omega/\square$, more preferably not more than 8,000$\Omega/\square$. When two or more layers meeting the first composition are included, each layer meeting the first composition has a sheet resistance which may fall inside or outside the range, and in either case, the overall chromium-containing film has a sheet resistance of not more than 10,000$\Omega/\square$, preferably not more than 8,000$\Omega/\square$, which is effective for preventing any charge buildup during EB writing of a resist pattern.

The chromium-containing film may be a film having any desired function, for example, an optical film such as a light-shielding film, antireflective film or phase shift film (e.g., halftone phase shift film), or an auxiliary processing film such as an etching mask film or etching stop film. In some cases, the optical film is inclusive of an auxiliary processing film functioning as an etching mask film or etching stop film, provided that after processing of the photomask blank into a photomask, that film is left on the photomask so that it may function as an optical film. It is noted that although the etching stop film is typically a film left on the photomask after processing of the photomask blank into a photomask, the etching mask film may be either a film left on the photomask or a film completely removed from the photomask (known as sacrificial film), after processing of the photomask blank into a photomask.

The materials of which the optical film and auxiliary processing film to constitute the photomask blank are made may be selected from transition metals, metals, alloys thereof, and compounds of such metals or alloys, depending on necessary optical properties and etching properties, as well as electric properties such as conductivity. Suitable transition metals include chromium (Cr), zirconium (Zr), tantalum (Ta), titanium (Ti), molybdenum (Mo), tungsten (W), iron (Fe), nickel (Ni) and cobalt (Co); suitable metals include silicon (Si), germanium (Ge) and aluminum (Al); and suitable compounds include oxides, nitrides, carbides, oxynitrides, oxycarbides, nitride carbides, and oxide nitride carbides of metals or alloys. Of the metals, chromium (Cr), molybdenum (Mo), and silicon (Si) are preferred.

The photomask blank of the invention is best suited as a photomask blank including a chromium-containing film which is patterned by oxygen-containing chlorine-base dry etching using a mask pattern of photoresist film (typically chemically amplified resist film) as an etching mask when the photomask blank is processed into a photomask.

Figure 1B:
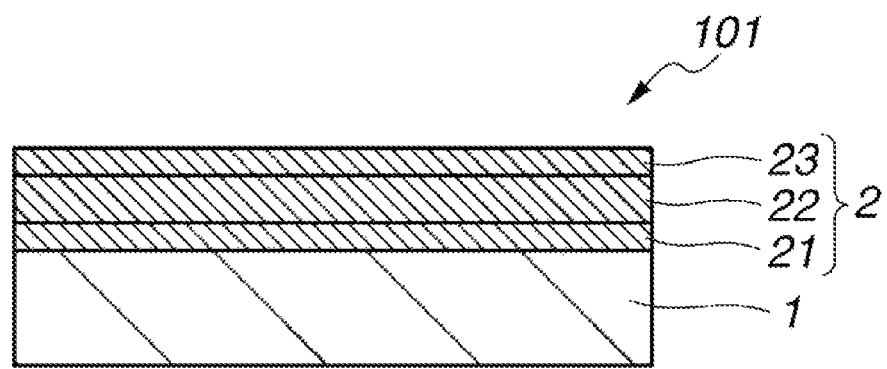

A first embodiment of the inventive photomask blank is a photomask blank having a chromium-contained film disposed directly on a transparent substrate. FIGS. 1A and 1B each are a cross-sectional view of one exemplary photomask blank of the first embodiment. The photomask blank 101 includes a transparent substrate 1 and a chromium-containing film 2 thereon. In FIG. 1A, the chromium-containing film 2 consists of a single layer, which meets the first composition. In FIG. 1B, the chromium-containing film 2 is of three-layer structure including a first chromium compound layer 21, a second chromium compound layer 22, and a third chromium compound layer 23 stacked in order from the substrate 1 side wherein one or two layers are layers meeting the first composition and the remainder, i.e., the remaining two or one layer is a layer not meeting the first composition. Typically, the photomask blank 101 is processed into a photomask by forming a resist film for EB lithography on the chromium-containing film 2 and performing EB imagewise writing. The photomask blank of the first embodiment may be a binary mask blank and in this case, it is preferred that the chromium-containing film be a light-shielding film.

In the first embodiment of the photomask blank, where the chromium-containing film is a light-shielding film, the chromium-containing film should preferably have an optical density of at least 2.5, more preferably at least 2.8 and up to 3.5, more preferably up to 3.2, with respect to the exposure light.

In the first embodiment of the photomask blank, where the chromium-containing film is a light-shielding film, the chromium-containing film preferably has a thickness of up to 75 nm, more preferably up to 70 nm, and even more preferably up to 65 nm, and at least 50 nm when the exposure light is ArF excimer laser; or a thickness of up to 90 nm, more preferably up to 80 nm, and even more preferably up to 75 nm, and at least 55 nm when the exposure light is KrF excimer laser.

A second embodiment of the inventive photomask blank including a chromium-containing film which is patterned by oxygen-containing chlorine-base dry etching using a mask pattern of photoresist film (typically chemically amplified resist film) as an etching mask when the photomask blank is processed into a photomask, is a photomask blank having a chromium-containing film disposed on a transparent substrate through one or more optical films. The photomask blank of the second embodiment is advantageous particularly when a pattern of the chromium-containing film functions as a hard mask in etching of the optical film, for example, because the pattern can be formed from the chromium-containing film at a high accuracy, and when the optical film is then patterned using the pattern of chromium-containing film, a pattern can also be formed at a high accuracy. Combinations of the chromium-containing film with the optical film include a combination of a light-shielding film with a phase shift film (e.g., halftone phase shift film) and a combination of an etching mask film with a light-shielding film.

Figure 2A:
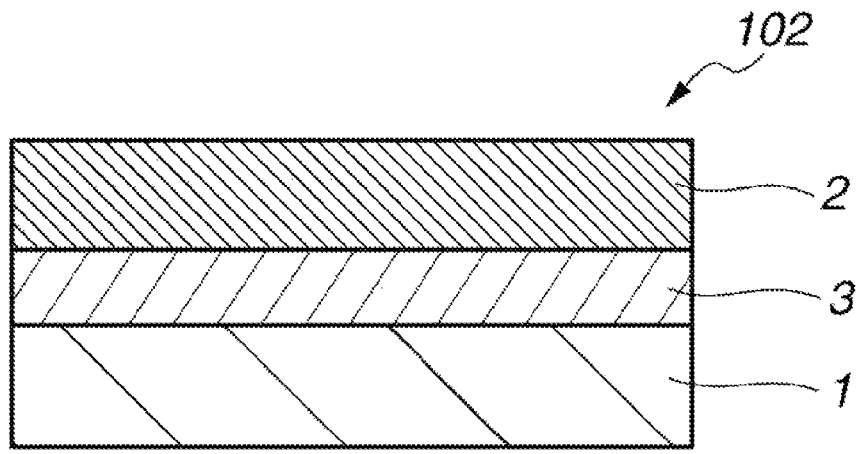
FIGS. 2A and 2B are a cross-sectional view of a photomask blank in a second embodiment of the invention, FIG. 2A showing a chromium-containing film of monolayer structure and FIG. 2B showing a chromium-containing film of multilayer structure.
Figure 2B:
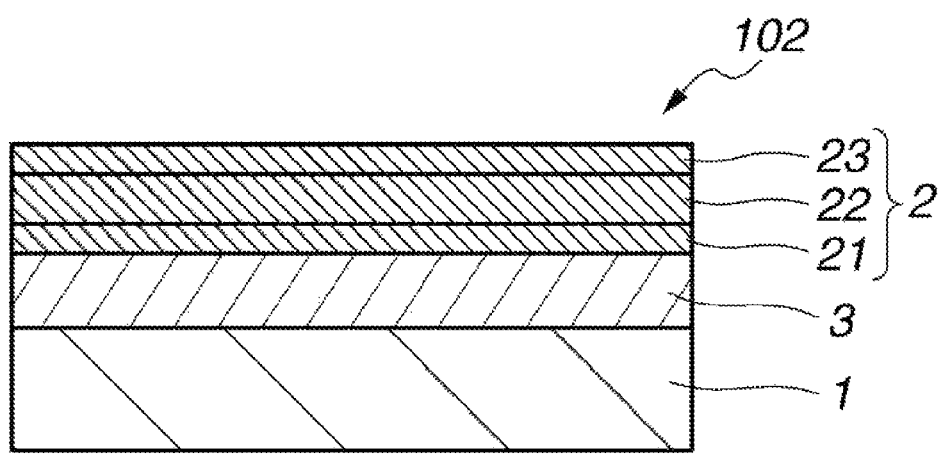

FIGS. 2A and 2B each are a cross-sectional view of one exemplary photomask blank of the second embodiment. The photomask blank 102 includes a transparent substrate 1, and an optical film 3 and a chromium-containing film 2 stacked thereon in order from the substrate 1 side. In FIG. 2A, the chromium-containing film 2 consists of a single layer, which meets the first composition. In FIG. 2B, the chromium-containing film 2 is of three-layer structure including a first chromium compound layer 21, a second chromium compound layer 22, and a third chromium compound layer 23 stacked in order from the substrate 1 side wherein one or two layers are layers meeting the first composition and the remainder, i.e., the remaining two or one layer is a layer not meeting the first composition. Typically, the photomask blank 102 is processed into a photomask by forming a resist film for EB lithography on the chromium-containing film 2 and performing EB imagewise writing. The photomask blank of the second embodiment may be a phase shift mask blank and in this case, it is preferred that the optical film be a phase shift film and the chromium-containing film be a light-shielding film.

The inventive photomask blank is also preferred as a photomask blank including a chromium-containing film which is patterned by oxygen-containing chlorine-base dry etching using a mask pattern of etching mask film as a hard mask when the photomask blank is processed into a photomask. A third embodiment is a photomask blank including a transparent substrate, a chromium-containing film, and an etching mask film which is disposed on the side of the chromium-containing film remote from the substrate, preferably contiguous to the chromium-containing film.

Figure 3A:
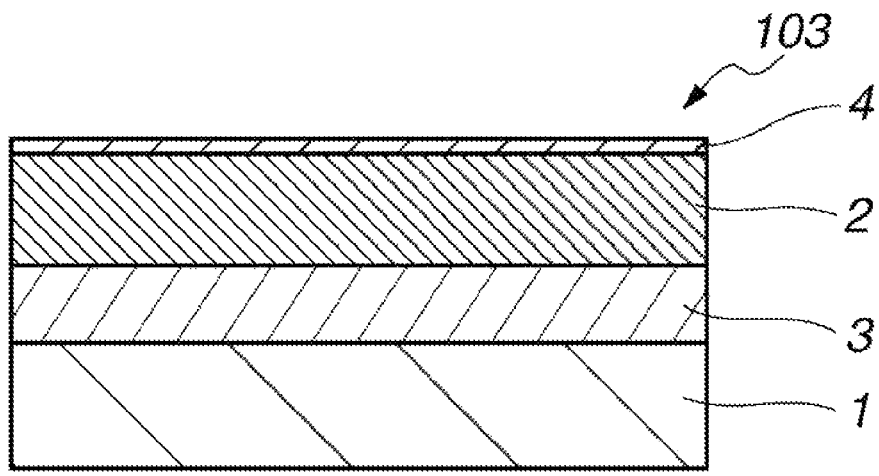
FIGS. 3A and 3B are a cross-sectional view of a photomask blank in a third embodiment of the invention, FIG. 3A showing a chromium-containing film of monolayer structure and FIG. 3B showing a chromium-containing film of multilayer structure.
Figure 3B:
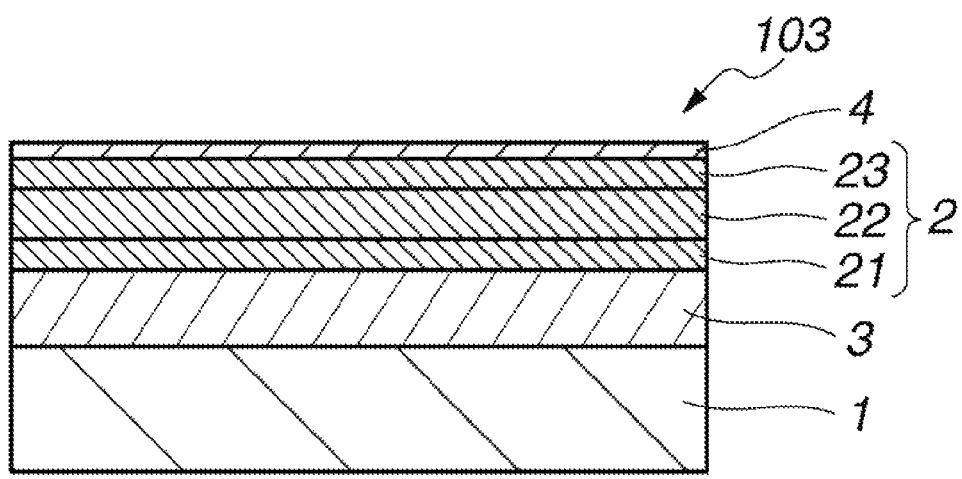
Figure 5:
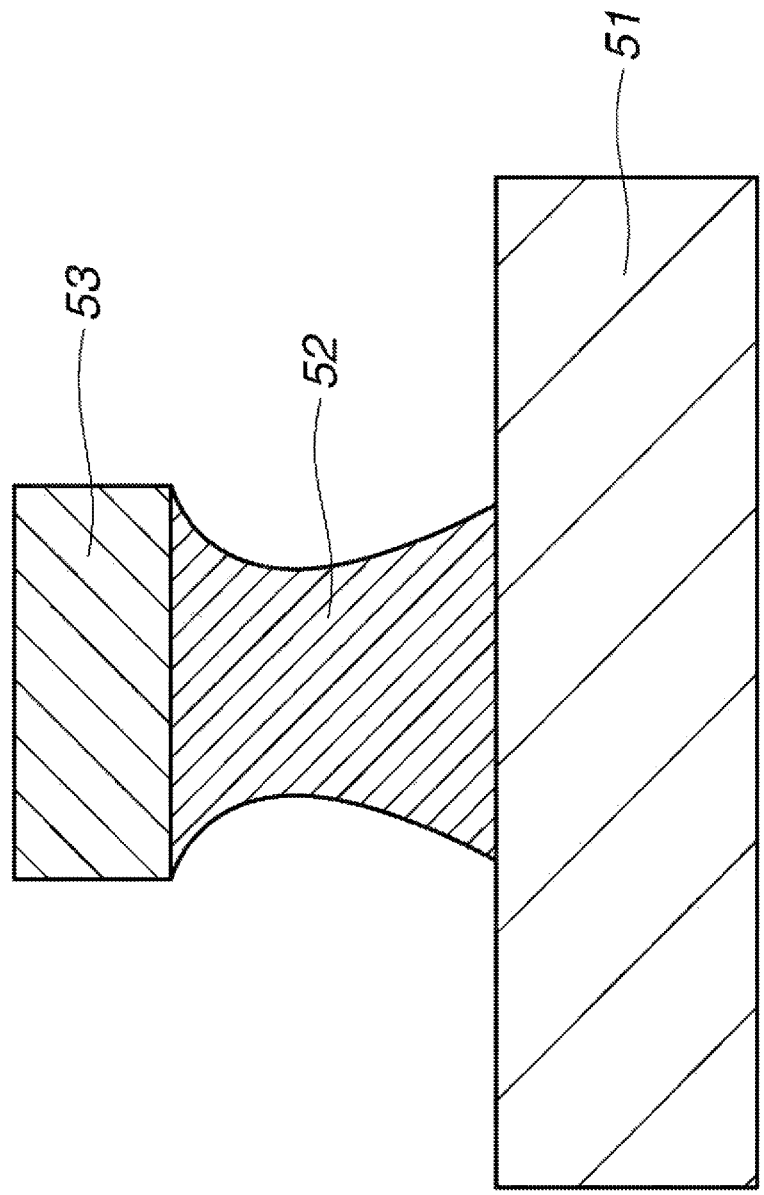
FIG. 5 is a schematic view of a cross-sectional profile of a pattern formed by isotropic dry etching.
Figure 6:
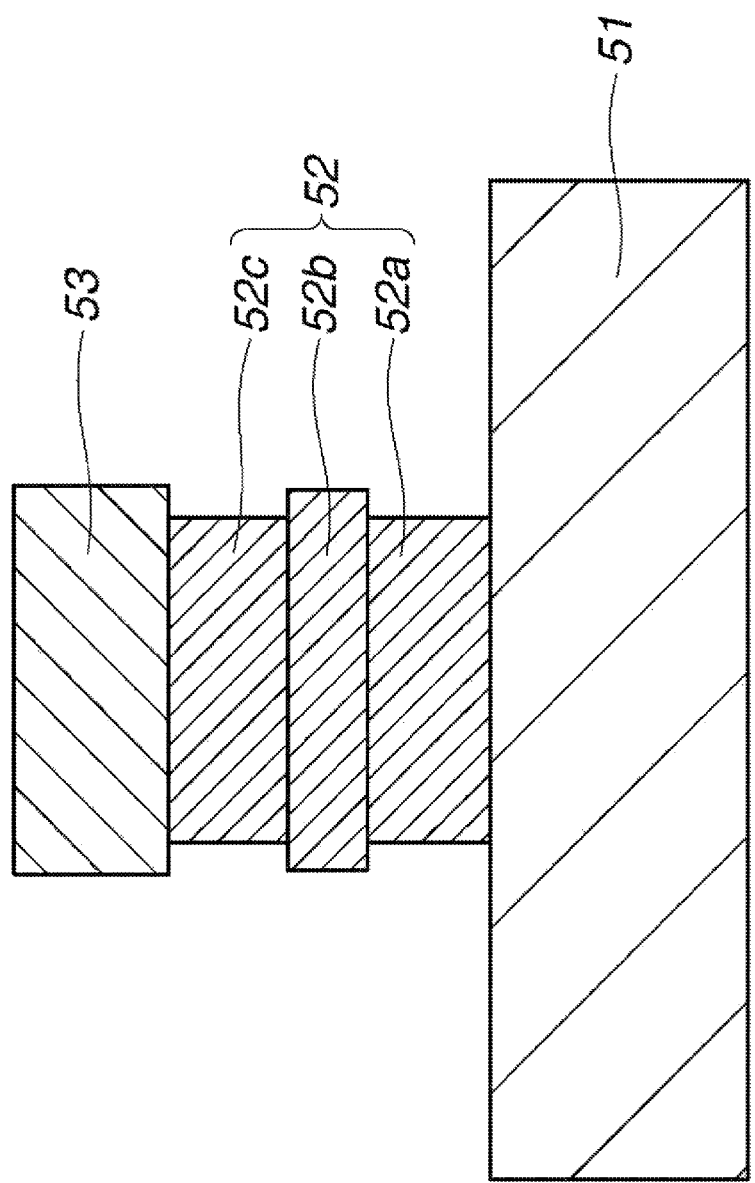
FIG. 6 is a cross-sectional view of a chromium-containing film having three chromium compound layers having different etching rates stacked, after dry etching.

FIGS. 3A and 3B each are a cross-sectional view of one exemplary photomask blank of the third embodiment. The photomask blank 103 includes a transparent substrate 1, and an optical film 3, a chromium-containing film 2 and an etching mask film 4 stacked in order from the substrate 1 side. In FIG. 3A, the chromium-containing film 2 consists of a single layer, which meets the first composition. In FIG. 3B, the chromium-containing film 2 is of three-layer structure including a first chromium compound layer 21, a second chromium compound layer 22, and a third chromium compound layer 23 stacked thereon in order from the substrate 1 side wherein one or two layers are layers meeting the first composition and the remainder, i.e., the remaining two or one layer is a layer not meeting the first composition. Typically, the photomask blank 103 is processed into a photomask by forming a resist film for EB lithography on the etching mask film 4 and performing EB imagewise writing. The photomask blank of the third embodiment may be a phase shift mask blank and in this case, it is preferred that the optical film be a phase shift film and the chromium-containing film be a light-shielding film.

In the first to third embodiments of the photomask blank, where the chromium-containing film is a film having an optical function such as a light-shielding film, the film must have a high resolution and high pattern transfer accuracy as well as the optical function. In this sense, the chromium-containing film must meet the desired optical function such as optical density, have a high etching rate in oxygen-containing chlorine-base dry etching, and form a mask pattern of improved cross-sectional profile having a minimal variation of line width in thickness direction.

In the photomask blank to be processed into a photomask adapted for pattern transfer using exposure light of wavelength 250 nm or less, a chromium-containing material is used. Among the chromium-containing materials, chromium alone and chromium compounds having a low content of light element such as oxygen, nitrogen or carbon are preferably used as a light-shielding film because they exert a significant light-shielding effect. Of these light-shielding film-forming materials, chromium alone and chromium compounds having a lower content of light element such as oxygen, nitrogen or carbon (referred to as "highly metallic chromium base material," hereinafter) have a low resistivity and are suited as the material for forming the conductivity-providing layer (conductive layer). When the chromium-containing film is constructed so as to include a conductive layer composed of highly metallic chromium base material, the chromium-containing film is endowed with conductivity.

On the other hand, chromium compounds having a high content of light element such as oxygen, nitrogen or carbon (referred to as "low metallic chromium base material," hereinafter) are effective for adjusting optical properties or etching properties of the chromium-containing film. The low metallic chromium base material is also effective for improving transmittance. Although a film formed of highly metallic chromium base material is a film with a high reflectance, which is sometimes disadvantageous in defect inspection on photomask blanks or photomasks, the low metallic chromium base material is also preferred as a material for forming an antireflection-providing layer (antireflective layer) which is applied in such cases. Further, where only a layer of highly metallic chromium base material provides insufficient light-shielding properties, a film of low metallic chromium base material may be formed to compensate for the shortage of light-shielding properties.

Reference is made to the photomask blank wherein the chromium-containing film is constructed by multiple layers including a layer meeting the first composition and a layer not meeting the first composition. In the first to third embodiments of the photomask blank, where the chromium-containing film is a light-shielding film, preferably the chromium compound layers include layers of two types, a chromium compound layer mainly functioning as conductive layer and a chromium compound layer mainly functioning as antireflective layer, wherein the former is a layer meeting the first composition and the latter is a layer not meeting the first composition. For example, it is preferred that a chromium compound layer mainly functioning as antireflective layer be formed on either one or both of the surface of the chromium-containing film disposed closest to the substrate and the surface of the chromium-containing film disposed remotest from the substrate and especially that a chromium compound layer functioning as antireflective layer be formed contiguous to a chromium compound layer functioning as conductive layer. Specifically referring to the chromium-containing film 2 shown in FIG. 1B, 2B or 3B, it is preferred that the second chromium compound layer 22 be a chromium compound layer mainly functioning as conductive layer, and the first and third chromium compound layers 21 and 23 be chromium compound layers mainly functioning as antireflective layer.

Although the thickness of the chromium compound layer functioning as antireflective layer is adjusted so as to meet the desired reflectance, it is preferred from the standpoint of minimizing the influence of thickness increase of chromium-containing film that the thickness be up to 20 nm, more preferably up to 10 nm, and at least 0.7 nm. If the thickness of the antireflective layer is below the range, such a thin layer may exert a poor reflectance-suppressing effect and be unstable to deposit.

In the photomask blank of the second embodiment, where the optical film is a phase shift film, typically halftone phase shift film, the phase shift film is desirably formed of a material containing silicon and being free of a transition metal, or a material containing silicon and a transition metal, preferably transition metal exclusive of chromium, especially molybdenum. Such materials include silicon alone, compounds containing silicon and a light element such as oxygen, nitrogen or carbon, especially one or both of oxygen and nitrogen, and such compounds having further added thereto a transition metal, preferably transition metal exclusive of chromium, specifically molybdenum, tantalum, tungsten, zirconium or titanium, especially molybdenum. Particularly when the phase shift film is a halftone phase shift film, the halftone phase shift film also has an optical density, which allows the thickness of the chromium-containing film to be reduced as compared with halftone phase shift film-free photomask blanks.

In the photomask blank of the second embodiment, where the chromium-containing film is a light-shielding film and the optical film is a halftone phase shift film, the chromium-containing film preferably has an optical density of at least 1.5, more preferably at least 1.8 and up to 2.6, more preferably up to 2.5, and even more preferably up to 2.4, with respect to the exposure light. The sum of optical densities of the chromium-containing film and phase shift film with respect to the exposure light is preferably at least 2.5, more preferably at least 2.8 and up to 3.5, more preferably up to 3.2. The desired light-shielding properties are obtained by adjusting the optical density of the chromium-containing film and the halftone phase shift film to the range.

In the second embodiment of the photomask blank, where the chromium-containing film is a light-shielding film and the optical film is a halftone phase shift film, the chromium-containing film preferably has a thickness of up to 50 nm, more preferably up to 47 nm, and even more preferably up to 44 nm, and at least 35 nm when the exposure light is ArF excimer laser; or a thickness of up to 80 nm, more preferably up to 70 nm, and even more preferably up to 65 nm, and at least 50 nm when the exposure light is KrF excimer laser.

On the other hand, the halftone phase shift film is set to a transmittance of preferably at least 2%, more preferably at least 5%, even more preferably at least 10%, most preferably at least 11% and up to 40%, more preferably up to 30%, even more preferably up to 20% with respect to the exposure light. The halftone phase shift film preferably has a thickness of up to 80 nm, more preferably up to 70 nm, and at least 50 nm, more preferably at least 60 nm when the exposure light is ArF excimer laser; or a thickness of up to 110 nm, more preferably up to 100 nm, and at least 70 nm, more preferably at least 80 nm when the exposure light is KrF excimer laser.

As in the third embodiment of the photomask blank, an etching mask film is provided as a hard mask serving in etching of the chromium-containing film, which allows the photoresist film to be thinned to comply with further pattern miniaturization. This etching mask film is typically used as a sacrificial film for the chromium-containing film. Most often, the etching mask film is completely removed in the photomask fabrication process. Sometimes, the etching mask film may be left in part, without complete removal, in the photomask fabrication process.

The etching mask film may be formed of a material which is quickly etched on fluorine-base dry etching, but has an extremely slow etching rate (i.e., is not substantially etched) on oxygen-containing chlorine-base dry etching. Suitable materials are silicon-containing materials, for example, silicon alone, compounds containing silicon and a light element such as oxygen, nitrogen or carbon, and such compounds having further added thereto a transition metal, preferably transition metal exclusive of chromium, specifically molybdenum, tantalum, tungsten, zirconium or titanium.

In the third embodiment of the photomask blank, where the optical film is a phase shift film, typically halftone phase shift film, the phase shift film is preferably formed of a material containing silicon and being free of a transition metal, or a material containing silicon and a transition metal, preferably transition metal exclusive of chromium, especially molybdenum. Suitable materials are as exemplified above for the second embodiment of the photomask blank. Particularly when the phase shift film is a halftone phase shift film, the halftone phase shift film also has an optical density, which allows the thickness of the chromium-containing film to be reduced as compared with halftone phase shift film-free photomask blanks.

In the third embodiment of the photomask blank, where the chromium-containing film is a light-shielding film, and the optical film is a halftone phase shift film, the optical density of the chromium-containing film with respect to exposure light, the sum of optical densities of the chromium-containing film and phase shift film with respect to exposure light, the thickness of the chromium-containing film, the transmittance of the halftone phase shift film, and the thickness of the halftone phase shift film preferably fall in the same ranges as in the second embodiment.

In the third embodiment of the photomask blank, where the chromium-containing film is a light-shielding film, the optical film is a halftone phase shift film, and the etching mask film is a film to be left in part, without complete removal, in the photomask fabrication process, i.e., a film to be left on a photomask and to function as an optical film, the sum of optical densities of the chromium-containing film, phase shift film and etching mask film with respect to the exposure light is preferably at least 2.5, more preferably at least 2.8 and up to 3.5, more preferably up to 3.2. The etching mask film has a thickness of preferably at least 3 nm, more preferably at least 5 nm and up to 15 nm, more preferably up to 10 nm.

In another example of the second embodiment, the photomask blank may be a binary mask blank. In this case, the optical film is a light-shielding film and the chromium-containing film is an etching mask film.

In the second embodiment of the photomask blank, where the chromium-containing film is an etching mask film, the film must have a high resolution and high pattern transfer accuracy as well as the optical function. In this sense, the chromium-containing film must meet the desired optical function, have a high etching rate in oxygen-containing chlorine-base dry etching, and form a mask pattern of improved cross-sectional profile having a minimal line width variation in thickness direction.

In the photomask blank which is processed into a photomask suitable for pattern transfer using exposure light of wavelength up to 250 nm, a chromium-containing material is often used. Among chromium-containing materials, highly metallic chromium base materials are preferred as the material for forming a low resistivity, conductive layer. When the chromium-containing film is constructed so as to include a conductive layer composed of highly metallic chromium base material, the chromium-containing film is endowed with conductivity.

On the other hand, the low metallic chromium base material is effective for adjusting the optical properties and etching properties of the chromium-containing film. The low metallic chromium base material is also effective for improving transmittance. Although a film formed of highly metallic chromium base material is a film with a high reflectance, which is sometimes disadvantageous in defect inspection on photomask blanks or photomasks, the low metallic chromium base material is also preferred as the material for forming an antireflective layer which is applied in such cases.

Reference is made to the photomask blank of the invention wherein the chromium-containing film is of multilayer structure including a layer meeting the first composition and a layer not meeting the first composition. In the second embodiment of the photomask blank, where the chromium-containing film is an etching mask film, it is preferred that the chromium compound layers include layers of two types, a chromium compound layer mainly functioning as conductive layer and a chromium compound layer mainly functioning as antireflective layer, wherein the former is a layer meeting the first composition and the latter is a layer not meeting the first composition. For example, it is preferred that a chromium compound layer mainly functioning as antireflective layer be formed on either one or both of the surface of the chromium-containing film disposed closest to the substrate and the surface of the chromium-containing film disposed remotest from the substrate and more preferably, a chromium compound layer functioning as antireflective layer be formed contiguous to a chromium compound layer functioning as conductive layer. Specifically referring to the chromium-containing film 2 in FIG. 2B, it is preferred that the second chromium compound layer 22 be a chromium compound layer mainly functioning as conductive layer, and the first and third chromium compound layers 21 and 23 be chromium compound layers mainly functioning as antireflective layer.

Although the thickness of the chromium compound layer mainly functioning as antireflective layer is adjusted so as to meet the desired reflectance, the thickness is typically up to 30 nm, preferably up to 20 nm, and more preferably up to 10 nm, and at least 0.7 nm. If the thickness of antireflective layer is below the range, such a thin layer may exert a poor reflectance-suppressing effect and be unstable to deposit.

In the second embodiment of the photomask blank, where the optical film is a light-shielding film, the light-shielding film is preferably formed of a material containing silicon and being free of a transition metal, or a material containing silicon and a transition metal, preferably transition metal exclusive of chromium, especially molybdenum. Suitable materials are as exemplified above for the phase shift film.

In the second embodiment of the photomask blank, where the optical film is a light-shielding film, the light-shielding film is set to an optical density of typically at least 2.5, preferably at least 2.8 and up to 3.5, preferably up to 3.2, with respect to the exposure light. The light-shielding film preferably has a thickness of up to 80 nm, more preferably up to 70 nm, and even more preferably up to 65 nm, and at least 50 nm, more preferably at least 55 nm when the exposure light is ArF excimer laser; or a thickness of up to 100 nm, more preferably up to 90 nm, and even more preferably up to 80 nm, and at least 55 nm, more preferably at least 60 nm when the exposure light is KrF excimer laser. On the other hand, where the chromium-containing film is an etching mask film, the chromium-containing film preferably has a thickness of at least 3 nm, more preferably at least 5 nm and up to 20 nm, more preferably up to 10 nm.

In a further embodiment of the photomask blank, another optical film may be formed on the surface of the chromium-containing film disposed remote from the transparent substrate, preferably contiguous to the chromium-containing film. The other optical film is preferably a light-shielding film, for example, formed of a material containing silicon and being free of a transition metal or a material containing silicon and a transition metal. Where such a light-shielding film is incorporated, the chromium-containing film may be an etching stop film or a phase shift film such as halftone phase shift film.

The preferred method for depositing a chromium-containing film, an optical film (e.g., phase shift film or light-shielding film) and an auxiliary processing film (e.g., etching mask film or etching stop film) on a photomask blank is film deposition by sputtering because a film having high in-plane uniformity of optical properties and less defects is available.

The chromium-containing film is deposited by sputtering. For example, a chromium target is used as the target. The sputtering gas is selected from such reactive gases as nitrogen gas ($N_2$), oxygen gas ($O_2$), nitrogen oxide gas ($N_2O$, $NO_2$), hydrocarbon gas (e.g., $CH_4$), and carbon oxide gas ($CO$, $CO_2$) in accordance with the desired constitutional elements. A rare gas such as argon gas (Ar) is optionally used along with the reactive gas. Film deposition may be performed by feeding the sputtering gas into a sputtering vacuum chamber, and adjusting the power applied to the target and the flow rate of sputtering gas such that each of chromium compound layers to constitute the chromium-containing film may become a layer meeting the first composition or a layer not meeting the first composition.

When a phase shift film or light-shielding film is deposited from a material containing silicon and being free of a transition metal or a material containing silicon and a transition metal, or when an etching mask film is deposited from a silicon-containing material, for example, the target is selected from silicon target, transition metal target, and transition metal-silicon target in accordance with the desired constitutional elements. The sputtering gas is selected from such reactive gases as nitrogen gas ($N_2$), oxygen gas ($O_2$), nitrogen oxide gas ($N_2O$, $NO_2$), hydrocarbon gas (e.g., $CH_4$), and carbon oxide gas ($CO$, $CO_2$) in accordance with the desired constitutional elements. A rare gas such as argon gas (Ar) is optionally used along with the reactive gas. Film deposition may be performed by feeding the sputtering gas into a sputtering vacuum chamber, and adjusting the power applied to the target and the flow rate of sputtering gas so as to form a film of the desired composition.

A photomask may be prepared from the photomask blank by the standard method. For example, a resist film of chemically amplified resist composition is formed on the photomask blank, followed by patternwise EB writing. Using the resist pattern as an initial etching mask, the underlying films including chromium-containing film, optical film (e.g., phase shift film, light-shielding film), auxiliary processing film (e.g., etching mask film, etching stop film) and transparent substrate are etched in sequence by a dry etching technique which is selected from oxygen-containing chlorine-base dry etching and fluorine-base dry etching in accordance with the material to be etched. In this way, a photomask pattern is formed, i.e., a photomask is obtained. When the chromium-containing film is processed by dry etching, the resulting pattern is of cross-sectional profile which is approximate to that of anisotropic dry etching, as shown in the schematic view of FIG. 4. It is noted that an organic conductive film may be formed on the resist film for further suppressing the charge buildup during EB writing.

EXAMPLE

Examples and Comparative Examples are given below by way of illustration and not by way of limitation.

Example 1

DC magnetron sputtering deposition was carried out on a quartz substrate of 152 mm squares and 6 mm thick. By sputtering a silicon target and feeding 15 sccm (flow rate) of Ar gas and 30 sccm of $N_2$ gas as the sputtering gas into the sputtering chamber, a SiN film of 62 nm thick was deposited on the substrate as a halftone phase shift film.

DC magnetron sputtering deposition was carried out by sputtering a metallic chromium target and feeding 45 sccm of $N_2$ gas as the sputtering gas into the sputtering chamber. A CrN layer of 45 nm thick was formed on the halftone phase shift film. There was obtained a photomask blank having a chromium-containing film of monolayer structure as a light-shielding film. The chromium-containing film had an optical density of 2.1 with respect to ArF excimer layer (wavelength 193 nm), and the sum of optical densities of chromium-containing film and halftone phase shift film was 3.0.

Example 2

DC magnetron sputtering deposition was carried out on a quartz substrate of 152 mm squares and 6 mm thick. By sputtering a silicon target and feeding 15 sccm (flow rate) of Ar gas and 30 sccm of $N_2$ gas as the sputtering gas into the sputtering chamber, a SiN film of 62 nm thick was deposited on the substrate as a halftone phase shift film.

DC magnetron sputtering deposition was carried out by sputtering a metallic chromium target and feeding 45 sccm of $N_2$ gas and 2 sccm of $O_2$ gas as the sputtering gas into the sputtering chamber. A CrON layer of 46 nm thick was formed on the halftone phase shift film. There was obtained a photomask blank having a chromium-containing film of monolayer structure as a light-shielding film. The chromium-containing film had an optical density of 2.1 with respect to ArF excimer layer (wavelength 193 nm), and the sum of optical densities of chromium-containing film and halftone phase shift film was 3.0.

Example 3

DC magnetron sputtering deposition was carried out on a quartz substrate of 152 mm squares and 6 mm thick. By sputtering a silicon target and feeding 15 sccm (flow rate) of Ar gas and 30 sccm of $N_2$ gas as the sputtering gas into the sputtering chamber, a SiN film of 62 nm thick was deposited on the substrate as a halftone phase shift film.

DC magnetron sputtering deposition was carried out by sputtering a metallic chromium target and feeding 45 sccm of $N_2$ gas as the sputtering gas into the sputtering chamber. A CrN layer of 44 nm thick mainly functioning as a conductive layer was formed on the halftone phase shift film. Next, DC magnetron sputtering deposition was carried out by sputtering a metallic chromium target and feeding 10 sccm of Ar gas, 30 sccm of $N_2$ gas, and 15 sccm of $O_2$ gas as the sputtering gas into the sputtering chamber. A CrON layer of 1 nm thick mainly functioning as an antireflective layer on the side remote from the substrate was formed. In this way, there was obtained a photomask blank having a chromium-containing film of two-layer structure and 45 nm thick as a light-shielding film. The chromium-containing film had an optical density of 2.1 with respect to ArF excimer layer (wavelength 193 nm), and the sum of optical densities of chromium-containing film and halftone phase shift film was 3.0.

Example 4

DC magnetron sputtering deposition was carried out on a quartz substrate of 152 mm squares and 6 mm thick. By sputtering a silicon target and feeding 15 sccm (flow rate) of Ar gas and 30 sccm of $N_2$ gas as the sputtering gas into the sputtering chamber, a SiN film of 62 nm thick was deposited on the substrate as a halftone phase shift film.

DC magnetron sputtering deposition was carried out by sputtering a metallic chromium target and feeding 45 sccm of $N_2$ gas and 1 sccm of $CH_4$ gas as the sputtering gas into the sputtering chamber. A CrNC layer of 46 nm thick was formed on the halftone phase shift film. There was obtained a photomask blank having a chromium-containing film of monolayer structure as a light-shielding film. The chromium-containing film had an optical density of 2.1 with respect to ArF excimer layer (wavelength 193 nm), and the sum of optical densities of chromium-containing film and halftone phase shift film was 3.0.

Example 5

DC magnetron sputtering deposition was carried out on a quartz substrate of 152 mm squares and 6 mm thick. By sputtering a target containing molybdenum and silicon in a molar ratio of 1:2 and a silicon target and feeding 30 sccm (flow rate) of Ar gas and 5 sccm of $N_2$ gas as the sputtering gas into the sputtering chamber, a MoSiN film of 45 nm thick was deposited on the substrate as a light-shielding film.

DC magnetron sputtering deposition was carried out by sputtering a metallic chromium target and feeding 45 sccm of $N_2$ gas as the sputtering gas into the sputtering chamber. A CrN layer of 10 nm thick was formed on the light-shielding film. There was obtained a photomask blank having a chromium-containing film of monolayer structure as an etching mask film.

Comparative Example 1

DC magnetron sputtering deposition was carried out on a quartz substrate of 152 mm squares and 6 mm thick. By sputtering a silicon target and feeding 15 sccm (flow rate) of Ar gas and 32 sccm of $N_2$ gas as the sputtering gas into the sputtering chamber, a SiN film of 61 nm thick was deposited on the substrate as a halftone phase shift film.

DC magnetron sputtering deposition was carried out by sputtering a metallic chromium target and feeding 9 sccm of Ar gas, 30 sccm of $N_2$ gas, and 14 sccm of $O_2$ gas as the sputtering gas into the sputtering chamber. A CrON layer of 20 nm thick mainly functioning as an antireflective layer on the substrate side was formed on the halftone phase shift film. Next, DC magnetron sputtering deposition was carried out by sputtering a metallic chromium target and feeding 20 sccm of Ar gas, 2 sccm of $N_2$ gas, and 2 sccm of $O_2$ gas as the sputtering gas into the sputtering chamber. A CrON layer of 4 nm thick mainly functioning as a conductive layer was formed. Further, DC magnetron sputtering deposition was carried out by sputtering a metallic chromium target and feeding 12 sccm of Ar gas, 30 sccm of $N_2$ gas, and 14 sccm of $O_2$ gas as the sputtering gas into the sputtering chamber. A CrON layer of 22 nm thick mainly functioning as an antireflective layer on the side remote from the substrate was formed. In this way, there was obtained a photomask blank having a chromium-containing film of three-layer structure and 46 nm thick as a light-shielding film. The chromium-containing film had an optical density of 2.0 with respect to ArF excimer layer (wavelength 193 nm), and the sum of optical densities of chromium-containing film and halftone phase shift film was 3.1.

Comparative Example 2

DC magnetron sputtering deposition was carried out on a quartz substrate of 152 mm squares and 6 mm thick. By sputtering a silicon target and feeding 15 sccm (flow rate) of Ar gas and 32 sccm of $N_2$ gas as the sputtering gas into the sputtering chamber, a SiN film of 61 nm thick was deposited on the substrate as a halftone phase shift film.

DC magnetron sputtering deposition was carried out by sputtering a metallic chromium target and feeding 10 sccm of Ar gas, 50 sccm of $N_2$ gas, and 5 sccm of $CH_4$ gas as the sputtering gas into the sputtering chamber. A CrNC layer of 45 nm thick mainly functioning as an antireflective layer on the substrate side was formed on the halftone phase shift film. Next, DC magnetron sputtering deposition was carried out by sputtering a metallic chromium target and feeding 30 sccm of Ar gas and 35 sccm of $N_2$ gas as the sputtering gas into the sputtering chamber. A CrN layer of 3 nm thick mainly functioning as a conductive layer was formed. Further, DC magnetron sputtering deposition was carried out by sputtering a metallic chromium target and feeding 10 sccm of Ar gas, 50 sccm of $N_2$ gas, and 10 sccm of $O_2$ gas as the sputtering gas into the sputtering chamber. A CrON layer of 3 nm thick mainly functioning as an antireflective layer on the side remote from the substrate was formed. In this way, there was obtained a photomask blank having a chromium-containing film of three-layer structure and 51 nm thick as a light-shielding film. The chromium-containing film had an optical density of 1.9 with respect to ArF excimer layer (wavelength 193 nm), and the sum of optical densities of chromium-containing film and halftone phase shift film was 3.0.

Comparative Example 3

DC magnetron sputtering deposition was carried out on a quartz substrate of 152 mm squares and 6 mm thick. By sputtering a target containing molybdenum and silicon in a molar ratio of 1:2 and a silicon target and feeding 30 sccm (flow rate) of Ar gas and 5 sccm of $N_2$ gas as the sputtering gas into the sputtering chamber, a MoSiN film of 45 nm thick was deposited on the substrate as a light-shielding film.

DC magnetron sputtering deposition was carried out by sputtering a metallic chromium target and feeding 20 sccm of Ar gas and 5 sccm of $N_2$ gas as the sputtering gas into the sputtering chamber. A CrN layer of 10 nm thick was formed on the light-shielding film. There was obtained a photomask blank having a chromium-containing film of monolayer structure as an etching mask film.

For the photomask blanks of Examples and Comparative Examples, each of chromium compound layers in the chromium-containing film was analyzed for composition by X-ray photoelectron spectroscopy (XPS). The results are shown in Table 1 together with whether or not formula (1) is met. Separately, a sheet resistance evaluation sample was prepared by forming each of the chromium-containing films in Examples and Comparative Examples directly on an insulating quartz substrate. Electric properties of the sample were measured by the four terminal method, from which the sheet resistance of the chromium-containing film was computed. The results are shown in Table 1.

Among the photomask blanks of Examples and Comparative Examples, the film thickness necessary to acquire the predetermined optical density was compared. Provided that the film is adjusted to an optical density of 2.0 with respect to ArF excimer laser (wavelength 193 nm), its thickness is designated optical density-standardized thickness. The film thickness was determined according to the formula: (thickness of chromium-containing film)×{2/(optical density of chromium-containing film)}. The results are shown in Table 1. With respect to the standardized thickness, a less thickness indicates better transfer performance on photomask use, with a thickness of up to 50 nm, especially up to 47 nm being desirable.

From the photomask blanks of Examples and Comparative Examples, the chromium-containing film was stripped by oxygen-containing chlorine-base dry etching. A time required for stripping, that is, etching clear time was measured. An etching clear time based on the optical density standard corresponding to an optical density of 2.0 with respect to ArF excimer laser (wavelength 193 nm) was determined according to the formula: (etching clear time measured)×{2/(optical density of chromium-containing film)}. The results are shown in Table 1. With respect to the standardized etching clear time, a shorter time is more effective for forming a pattern at a high resolution, with a time of up to 135 seconds, especially up to 130 seconds being desirable.

Next, on the chromium-containing film of each photomask blank in Examples and Comparative Examples, a resist film for EB lithography was deposited to a thickness of 100 nm. The resist film was exposed on an EB lithography system to a line-and-space pattern with a line width of 100 nm and developed to form a resist pattern. While the resist pattern was used as an etching mask, the chromium-containing film was etched by oxygen-containing chlorine-base dry etching under 75% over-etching conditions, i.e., for an etching time corresponding to 175% of the etching clear time computed from the etching rate of each chromium-containing film, for thereby transferring the line-and-space pattern to the chromium-containing film. The resist pattern was stripped off, and the line-and-space pattern was cut in transverse cross section. A cross-sectional profile of etched walls of lines in the chromium-containing film pattern was observed. The evaluation results of cross-sectional profile are shown in Table 1.

For the cross-sectional profile of lines, it is required that the variation of line width in thickness direction be nil and the cross-sectional profile be fully perpendicular. Evaluation is made by presetting a plane which is coplanar with both ends of resist pattern in width direction and perpendicular to the surface of chromium-containing film, using the plane as reference plane, and judging the chromium-containing film pattern to be negative when the actual cross section of chromium-containing film line is inwardly depressed from the reference plane, and positive when the actual cross section of film line is outwardly protruded, for evaluating a variation of line width of the chromium-containing film pattern in thickness direction. Provided that the thickness of the chromium-containing film is unity (1), the evaluation is good (○) when the maximum of a variation of line width in thickness direction is in a range between −0.05 and +0.05, mediocre (Δ) when the maximum is in a range of −0.1 to below −0.05, or more than +0.05 to +0.1, and poor (x) when the maximum is in a range of more negative than −0.1 or more than +0.1.

TABLE 1

| | | Thickness (nm) | Composition (at %) | | | | Formula (1) | Sheet resistance (Ω/□) | Optical density-standardized thickness (nm) | Etching clear time (sec) | Cross-sectional profile |
|---|---|---|---|---|---|---|---|---|---|---|---|
| | | | Cr | N | O | C | | | | | |
| Example | 1 | 45 | 49 | 51 | 0 | 0 | meet | 920 | 42 | 132 | ○ |
| | 2 | 46 | 46 | 45 | 9 | 0 | meet | 6,700 | 43 | 126 | ○ |
| | 3 | 44 | 49 | 51 | 0 | 0 | meet | 910 | 41 | 132 | ○ |
| | | 1 | 36 | 27 | 37 | 0 | meet | | | | |
| | 4 | 46 | 47 | 50 | 0 | 3 | meet | 1,200 | 43 | 129 | ○ |
| | 5 | 10 | 49 | 51 | 0 | 0 | meet | 4,100 | 42 | 131 | ○ |
| Comparative Example | 1 | 20 | 38 | 16 | 46 | 0 | meet | 170 | 45 | 135 | x |
| | | 4 | 67 | 18 | 15 | 0 | unmeet | | | | |
| | | 22 | 38 | 16 | 46 | 0 | meet | | | | |
| | 2 | 45 | 45 | 37 | 0 | 18 | unmeet | 6,000 | 55 | 104 | x |
| | | 3 | 50 | 50 | 0 | 0 | meet | | | | |
| | | 3 | 38 | 31 | 31 | 0 | meet | | | | |
| | 3 | 10 | 88 | 12 | 0 | 0 | unmeet | 100 | 34 | 168 | ○ |

While the invention has been illustrated and described in typical embodiments, it is not intended to be limited to the details shown. Various other embodiments, additions, modifications and deletions may occur to persons skilled in the art. All such embodiments fall within the spirit and scope of the invention as long as the effects and benefits of the invention are achieved.

Japanese Patent Application No. 2015-173895 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A photomask blank which is processed into a photomask suitable for pattern transfer using exposure light of wavelength up to 250 nm, comprising a transparent substrate and a chromium-containing film which is disposed on the substrate directly or through an optical film, wherein said chromium-containing film is constructed by a single chromium compound layer or at least two chromium compound layers, each chromium compound layer is formed of a chromium compound containing chromium and nitrogen, or chromium, nitrogen and oxygen, and has a composition having a chromium content of at least 30 at % and a total content of chromium, nitrogen and oxygen of at least 93 at %, and meeting the formula (1):

$$3Cr \leq 2O + 3N \tag{1}$$

wherein Cr is a chromium content (at %), O is an oxygen content (at %), and N is a nitrogen content (at %), when said chromium-containing film is constructed by a single chromium compound layer, the chromium compound layer meets a first composition having an atomic ratio of nitrogen/chromium of at least 0.95, a chromium content of at least 40 at %, a total content of chromium and nitrogen of at least 80 at %, and an oxygen content of up to 10 at %, when said chromium-containing film is constructed by at least two chromium compound layers, the chromium compound layers include at least one chromium compound layer meeting the first composition having an atomic ratio of nitrogen/chromium of at least 0.95, a chromium content of at least 40 at %, a total content of chromium and nitrogen of at least 80 at %, and an oxygen content of up to 10 at %, the total thickness of said at least one chromium compound layer meeting the first composition is in a range of more than 70% to 100% of the overall thickness of the chromium-containing film, and said chromium-containing film has a sheet resistance of not more than 10,000 Ω/□.

2. The photomask blank of claim 1 wherein said chromium-containing film has an optical density of 2.5 to 3.5 with respect to the exposure light.

3. The photomask blank of claim 1 wherein the chromium-containing film is disposed on the transparent substrate through the optical film, and the optical film includes a phase shift film formed of a material containing silicon and being free of a transition metal or a material containing silicon and a transition metal.

4. The photomask blank of claim 3, further comprising an etching mask film disposed on the side remote from the substrate of the chromium-containing film, the etching mask film being formed of a silicon-containing material.

5. The photomask blank of claim 3 wherein said chromium-containing film has an optical density of 1.5 to 2.6 with respect to the exposure light.

6. The photomask blank of claim 3 wherein the sum of optical densities of the chromium-containing film and the phase shift film with respect to the exposure light is 2.5 to 3.5.

7. The photomask blank of claim 4 wherein the sum of optical densities of the chromium-containing film, the phase shift film, and the etching mask film with respect to the exposure light is 2.5 to 3.5.

8. The photomask blank of claim 1 wherein the chromium-containing film is disposed on the transparent substrate through the optical film, and the optical film includes a light-shielding film formed of a material containing silicon and being free of a transition metal or a material containing silicon and a transition metal.

* * * * *